United States Patent [19]

Terada et al.

[11] Patent Number: 4,805,151
[45] Date of Patent: Feb. 14, 1989

[54] NONVOLATILE SEMICONDUCTOR MEMORY DEVICE

[75] Inventors: Yasushi Terada; Takeshi Nakayama; Kazuo Kobayashi; Kenji Noguchi, all of Hyogo, Japan

[73] Assignee: Mitsubishi Denki Kabushiki Kaisha, Tokyo, Japan

[21] Appl. No.: 48,571

[22] Filed: May 11, 1987

[30] Foreign Application Priority Data

May 13, 1986 [JP] Japan ................................ 61-111318

[51] Int. Cl.[4] ............................................... G11C 7/00
[52] U.S. Cl. ..................................... 365/189; 365/218
[58] Field of Search ............... 365/189, 218, 230, 233, 365/235, 239, 240

[56] References Cited

PUBLICATIONS

*IEEE Journal of Solid-State Circuits,* "An Enhanced 16K E²PROM", by Lubin Gee et al, vol. SC-17, No. 5, Oct. 1982.

*Primary Examiner*—Joseph A. Popek
*Attorney, Agent, or Firm*—Lowe, Price, Leblanc, Becker & Shur

[57] ABSTRACT

In an EEPROM capable of writing data in a page mode, an output portion of a Y decoder is provided with a column latch circuit for storing a Y gate line selected by a Y decoder at the time of writing data. The column latch circuit activates the Y gate line selected in response to the stored information at the cycle of verifying erasing and connects a memory cell connected to the Y gate line to a data output line. Thus, it can be determined whether the erased memory cell was surely erased or not in a page mode.

7 Claims, 4 Drawing Sheets

NONVOLATILE SEMICONDUCTOR MEMORY DEVICE

BACKGROUND OF THE INVENTION

1. Field of the Invention

The present invention relates to a nonvolatile semiconductor memory device and more particularly, to a structure of a verify circuit for verifying an operation of writing and erasing data in an electrically programmable and erasable nonvolatile semiconductor memory device operable in a page mode which can write data of a plurality of bytes at a time.

2. Description of the the Prior Art

FIG. 1 is a diagram showing a schematic structure of a conventional electrically programmable and erasable nonvolatile semiconductor memory device. In FIG. 1, the conventional electrically programmable and erasable nonvolatile semiconductor memory device (referred to as an EEPROM hereinafter) comprises memory cells 1 arranged in a matrix manner including rows and columns for storing information, an X decoder 3 for decoding a row designating signal (a row address signal) externally generated and selecting a corresponding row selecting signal line (a word line) 2, a Y decoder 5 for decoding a column address signal (a column designating signal) externally generated and selecting a corresponding column selecting signal line (a bit line) 4, data latch circuits 6 for temporalily storing data to be written into the memory cells 1, latch circuits 6a for storing selected control gate lines 20, Y selecting transistors 8 responsive to an output of the Y decoder 5 for connecting the bit line 4 connected thereto to an I/O line 7 serving as a data output line, and sense amplifiers 9 for detecting and amplifying a signal appearing on the I/O line 7. In addition, a control transistor 10 is provided in correspondence to each memory cell to control an operation of writing and erasing data in the memory cell 1.

The memory cell 1 comprises a selecting transistor 12 having a drain connected to the bit line 4, a source connected to a drain of a memory transistor 13 and a gate connected to an output signal line of the X decoder 3, i.e., the word line 2, and the memory transistor 13 having a drain connected to a source of the selecting transistor 12, a source connected to a ground potential and a control gate connected to the control gate line 20 through the control transistor 10. The memory transistor 13 has a floating gate for storing charges.

The control transistor 10 for controlling charge storage operation (writing and erasing of information) of the memory transistor 13 has a source connected to a control gate of the memory transistor 13, a drain connected to the control gate line 20 and a gate connected to the word line 2.

The bit line 4 is connected to the I/O line 7 through the Y selecting transistor 8, and the control gate line 20 is connected to a control line 21 through a Y selecting transistor 8a. An output signal of the Y decoder 5 is transferred to gates of the Y selecting transistors 8 and 8a through a Y gate line 22.

A memory cell 100 of one byte comprises eight memory cells 1 (one byte) connected to each other in parallel and a single control transistor 10 provided in correspondence to the memory cells 1, so that data can be written for each one byte.

The bit line 4 is provided with the data latch circuit 6 and the control gate line 20 is provided with the latch circuit 6a. The latch circuits 6 and 6a are activated in response to a high potential pulse signal $V_{pp}$. The latch circuits 6 and 6a output signals at an "L" level when they latch data at an "L" level and generate signals at a high potential $V_{pp}$ level when they latch a signal at an "H" level.

Operation is now described. In operation of one bit by one bit, description is now made on operation for erasing data of the memory cell 1 (writing of information "1"). In this case, a word line (i.e. a control gate line) 2 selected by the X decoder 3 becomes the high potential $V_{pp}$ level. The word line 2 is generally provided with a latch circuit (not shown) for further boosting to the high potential $V_{pp}$ level when the word line 2 is selected to be an "H" level. At that time, a latch circuit connected to a non-selected word line does not operate and outputs a signal which remains at an "L" level. On the other hand, the Y selecting transistors 8 and 8a connected to the Y gate line 22 selected by the Y decoder 5 are turned on, so that the control gate line 2 connected to the selected Y gate line 22 becomes an "H" level through the control line 21. The selected control gate line 2 at an "H" level is further boosted to the high potential $V_{pp}$ level by the latch circuit 6a. At the same time, the potential on the bit line 4 becomes a ground potential level through the I/O line 7 and the latch circuit 6. In this state, the high potential $V_{pp}$ is applied to the control gate of the memory transistor 13 through the control transistor 10 and the drain thereof is connected to the bit line 4 at the ground potential through the selecting transistor 12. As a result, electrons are injected from the drain to the floating gate in the memory transistor 13. Accordingly, the threshold voltage of the memory transistor is shifted to a higher level, so that the memory transistor is of an enhancement type. Thus, information "1" is written, that is, the information of the memory cell is erased.

Description is now made on programming, i.e., data writing (writing of information "0"). The potential on the word line 2 selected by the X decoder 3 is boosted to the high potential $V_{pp}$ level. Then, the Y selecting transistors 8 and 8a connected to the Y gate line 20 selected by the Y decoder 5 are turned on, so that data is written to the latch circuits 6 and 6a. When the data to be written is "0", a signal at an "H " level is transferred to the latch circuit 6a, which transfers a signal at the ground potential level. Then, an output of the Y decoder 5 becomes an "L" level, so that the Y selecting transistors 8 and 8a are turned off. Therefore, a signal at the high potential $V_{pp}$ level is applied to the bit line 4 to which data is to be written through the latch circuit 6. At that time, since the control gate line 20 is at the ground potential and the selected word line 2 is at the high potential $V_{pp}$ level, the high potential $V_{pp}$ is applied to the drain of the memory transistor 13 and the control gate thereof becomes the ground potential level through the control transistor 10. As a result, electrons flow from the floating gate to the drain in the memory transistor 13. Accordingly, the threshold voltage of the memory transistor 13 is shifted to a lower level, so that the memory transistor 13 is of a depletion type. That is, information "0 " is written. More specifically, a program (information "0") is written to the memory cell to which data "0 " is to be written.

In reading out data, the X decoder 3 transfers a signal at an "H" level to the selected word line 2. The Y decoder 5 decodes a column address signal applied thereto and transfers a signal at an "H" level to the corresponding Y gate line 22. The control line 21 is forced to the ground potential level or a predetermined potential level lower than a power supply potential level. At that time, since a signal at an "H" level is transferred to the gates of the Y selecting transistors 8 and 8a connected to the selected Y gate line 22, the Y selecting transistor 8 and 8a are turned on, so that the corresponding bit line 4 is connected to the I/O line 7. When the memory transistor 13 included in the selected memory cell is in an erased state, that is, information "1" is written so that the memory transistor 13 is of an enhancement type, the memory transistor 13 is turned off, so that no current flows from the I/O line 7 to the bit line 4. On the other hand, when information "0" is written to the memory transistor 13 in the selected memory cell so that the memory transistor is of a depletion type, the memory transistor 13 is turned on, so that current flows from the I/O line 7 through the bit line 4, the selecting transistor 12 and the memory transistor 13. The sense amplifier 9 provided in correspondence to the I/O line 7 detects whether current flows through the I/O line 7 or not and determines whether information stored in the selected memory cell is "1" or "0".

The conventional EEPROM has a page mode operation for collectively writing data for a plurality of bytes in order to write data at high speed. In a page mode operation, data are collectively written and erased for memory cells connected to a selected page (a selected single word line).

In a page mode operation, data for bytes selected out of one page to be written are temporalily latched to the latch circuits 6. After the data are latched in the latch circuits 6, data of the memory cells 1 connected to the selected word line 2 are erased and then, the data latched in the latch circuits 6 are collectively written into the corresponding memory cells in response to the high potential signal $V_{pp}$.

The conventional nonvolatile semiconductor memory device as described above is not provided with an erasing verify circuit. Therefore, when data are collectively written to a plurality of bytes in a page mode, it is not verified whether a data is surely erased or not before writing data for all the selected bytes, so that the data is liable to be erroneously written.

There is considered another approach in which in a page mode writing operation, after data for the selected bytes out of one page are written and are latched by the latch circuits and then, data of the selected memory cells from one page are erased, it may be verified whether the data have been surely erased or not for the last selected byte out of one page. In this case, it is verified that the data has been erased only for the last selected byte out of one page but not verified that the data has been erased for the other bytes, so that it can not be verified whether all data have been surely erased or not for the selected bytes out of one page.

In an EEPROM which is programmable in a byte mode in which writing is made on byte by byte, a written data verify circuit for detecting whether data is surely written or not is discussed in an article by Lubin Gie et al., entitled "An Enhanced 16K E²PROM", IEEE Journal of Solid-State Circuits, Vol. SC-17, No. 5, 1982, pp. 828–832. However, the prior art does not disclose an erased data verify circuit for detecting whether data is surely erased or not in an EEPROM operable in a page mode.

SUMMARY OF THE INVENTION

A primary object of the present invention is to remove the above described disadvantages and to provide a nonvolatile semiconductor memory device capable of detecting whether erasing operation is surely performed or not for memory cells of the selected bytes from one page at the time of writing in a page mode.

The nonvolatile semiconductor memory device according to the present invention comprises column latch means for temporalily storing a column selected by column selecting means. The column latch means stores the selected column at the time of data writing cycle, activates the selected column in response to latched information at the time of operation cycle for verifying that data has been erased and connects a memory cell connected to the column to a data output line.

Therefore, when an erase determination circuit is provided in an output portion of a sense amplifier provided for the data output line, it can be detected whether information stored in the memory cell connected to the selected column during an erasing cycle is erased or not.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
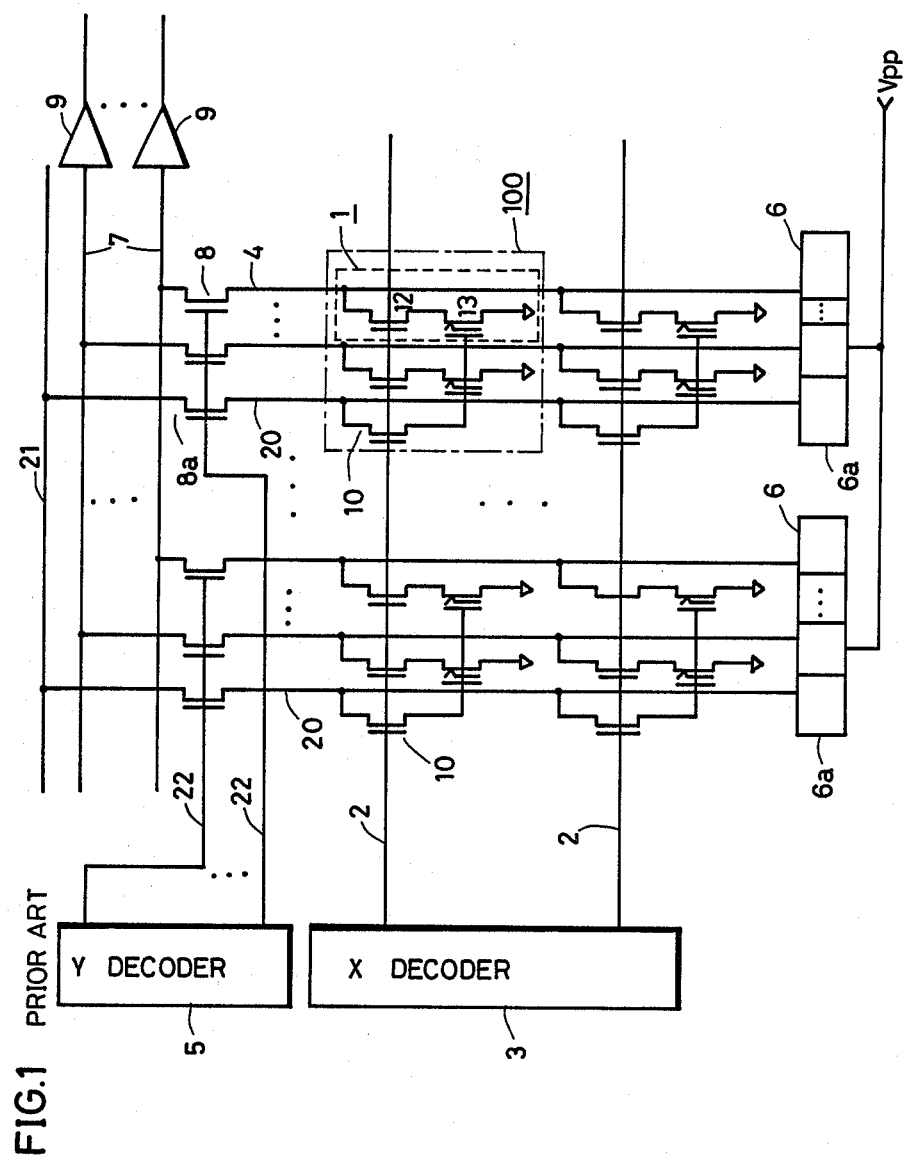
FIG. 1 is a diagram showing an example of a structure of a conventional nonvolatile semiconductor memory device.
Figure 2:
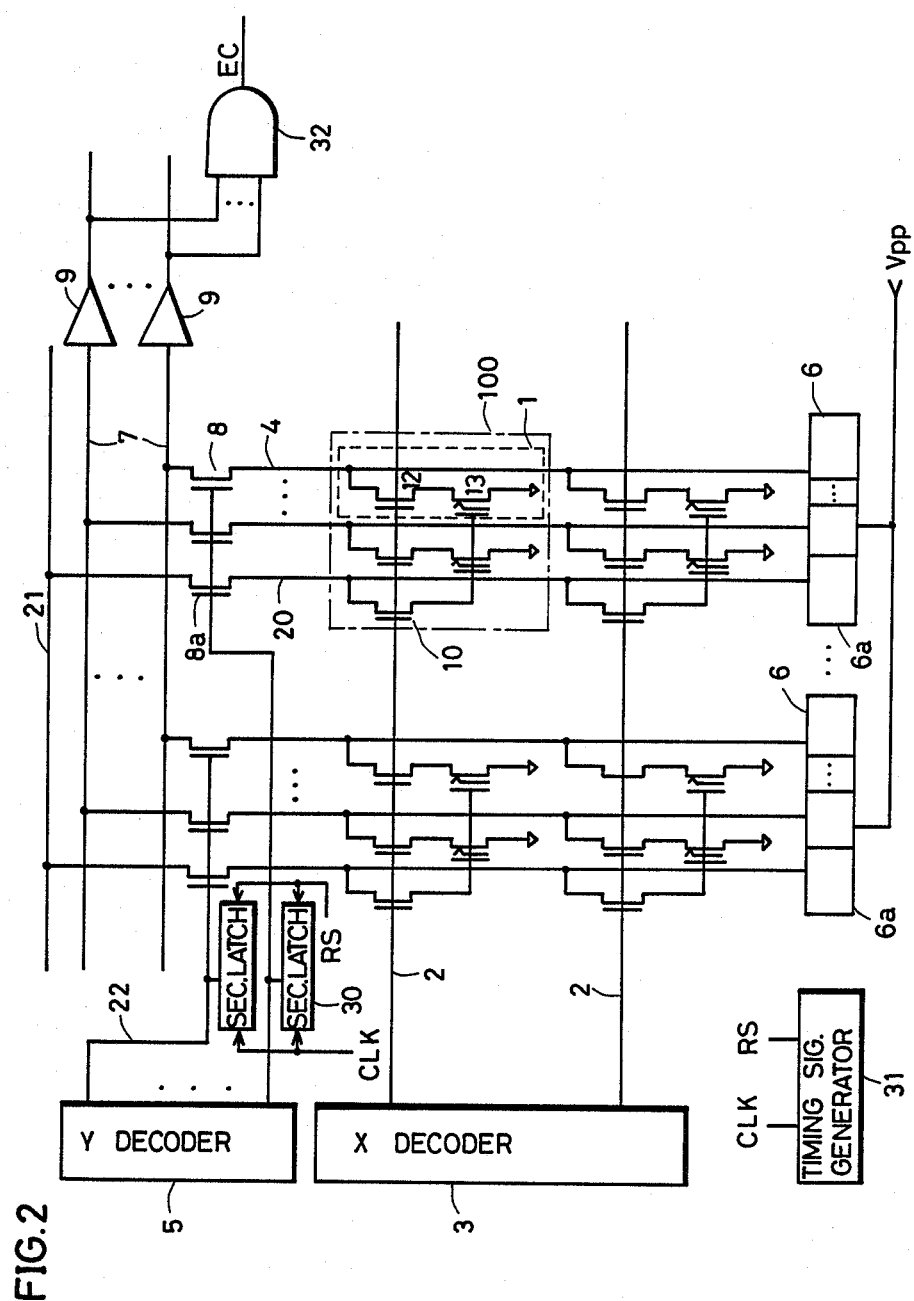
FIG. 2 is a diagram showing a schematic structure of a nonvolatile semiconductor memory device according to an embodiment of the present invention.

FIG. 2 is a diagram showing a schematic structure of a nonvolatile semiconductor memory device according to an embodiment of the present invention. In FIG. 2, portions corresponding to those in the conventional nonvolatile semiconductor memory device shown in FIG. 1 have the identical reference numerals. In FIG. 2, an EEPROM according to the present invention comprises second latch circuits 30 for storing selected columns and an AND gate 32 for determining whether information in selected memory cells is surely erased. The second latch circuits 30 are provided for respective Y gate line 22. The second latch circuit 30 is set to store a signal of "H" when a corresponding Y gate line 22 is selected to be an active level or "H" by the Y decoder 5 in data-writing cycle, and supplies the latched signal onto the corresponding Y gate line 22 in data-erase cycle, in response to a signal from a timing signal generator 31. AND gate 32 receives output signals from the sense amplifiers 9 to output a signal EC. Operation of the second latch circuit 30 is controlled by a clock signal CLK and a reset signal RS from a timing signal generator 31. The clock signal CLK provides timing for latching data of the second latch circuit 30 and, while the reset signal RS is generated when the EEPROM is powered on and when the erasing verify cycle included in the writing cycle is terminated, so that the second latch 30 is reset. The other structure is the same as that described referring to FIG. 1.

Figure 3:
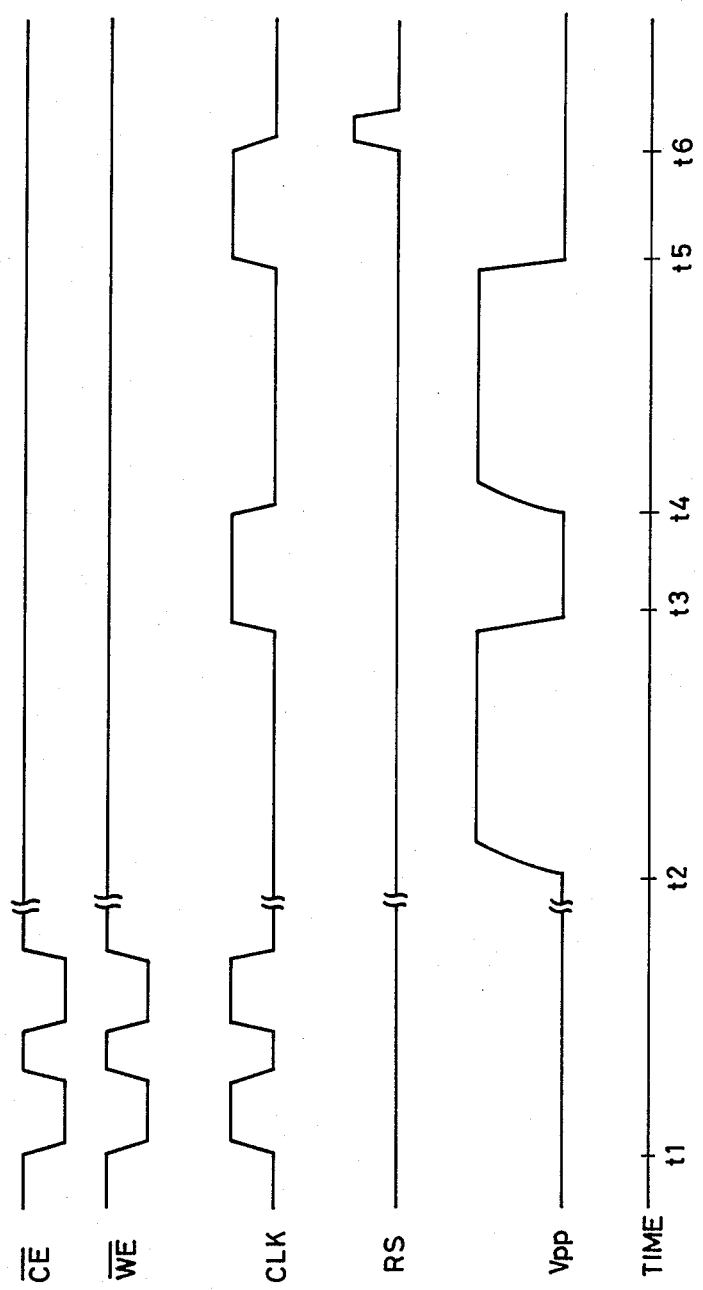
FIG. 3 is a waveform diagram of signals showing operating timing at the time of verifying data writing and erasing in the nonvolatile semiconductor memory device according to an embodiment of the present invention.

FIG. 3 is a waveform diagram showing operating timing of the nonvolatile semiconductor memory device according to an embodiment of the present invention. Referring now to FIGS. 2 and 3, operation is now described. When the power supply is switched on, the second latch circuits 30 are reset.

At the time t1, the data writing cycle starts. Accordingly, a chip enable signal $\overline{CE}$ and a write enable signal $\overline{WE}$ become active levels of "L", so that data is accepted. An X decoder 7 and a Y decoder 3 decode address signals applied thereto in synchronization with the chip enable signal $\overline{CE}$ and a write enable signal $\overline{WE}$. Thus, a corresponding word line 2 and the Y gate line 22 become "H" levels, so that a row and columns are selected. At that time, the second latch circuit 30 latches the "H" level on the selected Y gate line 22 in synchronization with the clock signal CLK from the timing signal generator 31 to be set. In this state, Y selecting transistors 8 and 8a are rendered conductive through the Y gate line 22 selected by the Y decoder 5, data written through an I/O line 7 is applied from a data input buffer (not shown) and is latched in latch circuits 30 6. At that time, a signal at an "H" level is applied to a control line 21 and is latched in a latch circuit 6a through a control gate line 20.

At the time t2, all data for the selected bytes from one page are written and are latched in the latch circuits 6. Then, the signals $\overline{CE}$ and $\overline{WE}$ become inactive levels, so that external access is prohibited. As a result, the internal data writing cycle is performed in which data latched in the latch circuits 6 are written to corresponding memory cells, respectively. At that time, prior to writing data into the memory cells from the latch circuits 6, an erasing operation cycle is performed in which data of the selected memory cells from one page connected to the word line 2 selected by an X decoder 3 are erased. In the erasing operation cycle, a high potential pulse $V_{pp}$ is generated. Thus, the high potential $V_{pp}$ is applied to a control gate of a memory transistor 13 through a control transistor 10 connected to the selected word line 2, and bit lines 4 are made at a ground potential. The potentials on the control gate lines 20 and the bit lines 4 are set through the latch circuits 6 and 6a under the control of the high potential pulse $V_{pp}$. As a result, data of the selected byte cells included in one page are erased. That is, information "1" is written into the selected memory cells from one page.

At the time t3, the erasing verify cycle is performed. More specifically, the second latch circuits 30 are activated in response to the clock sinal CLK from the timing signal generator 31, and information latched by the second latch circuits 30 is transferred to the corresponding Y gate line 22. Only the second latch circuits 30, which are connected to Y gate lines selected by the Y decoder 5, outputs a signal at an "H" level and applies it to respective gate of the Y selecting transistors 8 and 8a in response to the clock signal CLK. As a result, the Y bit lines 4 of all the selected byte cells connected to one page is connected to the I/O line 7, so that information stored in each memory cell is applied to an AND gate 32 through the sense amplifiers 9. When at least one memory transistor exists whose information is not erased, that is, which remains in a depletion state, of all byte memory cells for which erase operation was performed, current flows through either of the I/O lines 7, so that current flow is detected by the sense amplifier 9 connected thereto. All outputs of the sense amplifier 9 are applied to the AND gate 32. Thus, if and when an output of the AND gate 32 is an "H" level, no current flows on the I/O lines 7, that is, all the byte memory cells are surely erased and stores information "1", so that it can be detected that all the selected byte memory cells from the selected one page are surely erased. If the output of the AND gate 32 is an "L" level, current flows through either of the I/O lines 7, so that a memory cell of at least one bit stores information "0", so that it is determined that all the byte memory cells are not surely erased.

At the time t4, the high potential pulse $V_{pp}$ is generated again. Thus, erasing operation is repeated when all the selected memory cells are not erased. At that time, it can be determined whether the erasing cycle is performed again or not in response to the output of the AND gate 32 if timing for generating the pulse in, for example, the high potential pulse $V_{pp}$ generating means (not shown) is controlled by the output of the AND gate 32.

At the time t5, the erasing verify cycle is performed again. Accordingly, the second latch circuits 30 are activated, so that erasing operation is performed again in the manner described above.

At the time t6, an output EC of the AND gate 32 becomes an "H" level. Accordingly, the reset signal RS is generated from the timing signal generator 31, so that all the second latch circuits 30 are reset. As a result, the subsequent cycle, i.e. operation of collectively writing data latched in the latch circuits 6 into the selected byte memory cells from the selected one page is performed.

Figure 4:
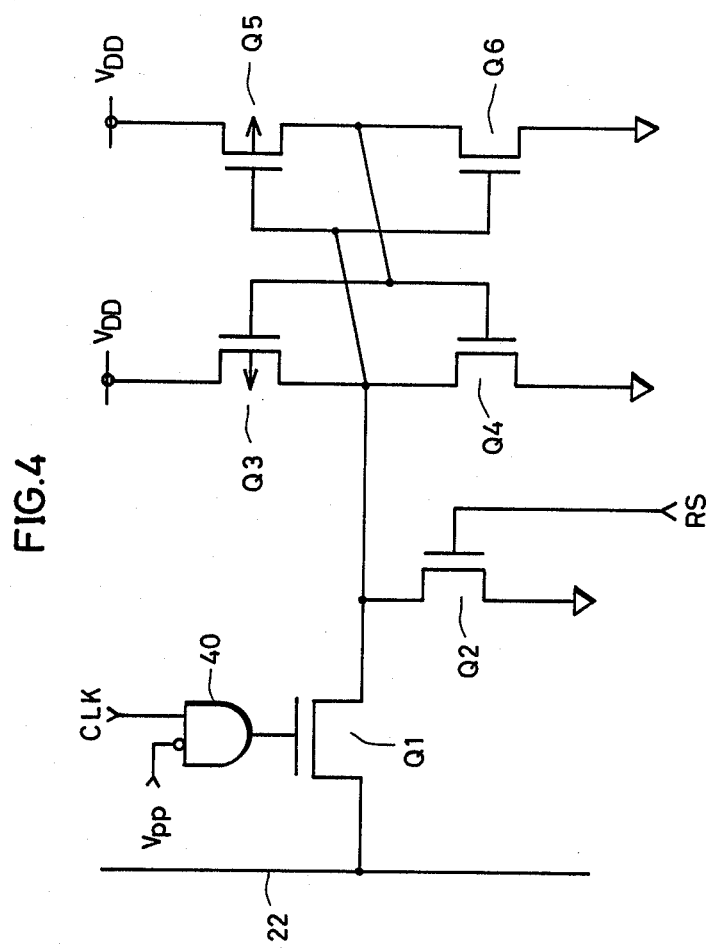
FIG. 4 is a diagram showing an example of a structure of a second latch circuit used in the nonvolatile semiconductor memory device according to an embodiment of the present invention.

FIG. 4 is a diagram showing an example of a specific structure of the second latch circuit used in the nonvolatile semiconductor memory device shown in FIG. 2. In FIG. 4, the second latch circuit comprises an AND gate 40 receiving an inverted signal of a high potential pulse signal $V_{pp}$ and the signal CLK, an n channel MOS transistor Q1 receiving at its gate an output of the AND gate 40 to turn on or off responsive thereto for electrically connecting the Y gate line 22 and a flip-flop comprising transistors Q3 to Q6, an n channel MOS transistor Q2 provided between the other conduction terminal of the MOS transistor Q1 and an output terminal of the flip-flop for resetting an output of the flip-flop in response to the reset signal RS, and the flip-flop comprising the transistors Q3 to Q6 for latching a signal on the Y gate line 22.

The flip-flop comprises two CMOS inverters. A first inverter comprises the p channel MOS transistor Q3 and the n channel MOS transistor Q4 connected to each other in a complementary manner. A second inverter comprises the p channel MOS transistor Q5 and the n channel MOS transistor Q6 connected to each other in a complementary manner. An output of the first inverter is connected to an input of the second inverter and an input of the first inverter is connected to an output of the second inverter.

Description is now made on operation. When the Y gate line 22 is selected to be an "H" level and the clock signal CLK becomes an "H" level, the MOS transistor Q1 is turned on in response to the output of the AND gate 40 because the high potential pulse $V_{pp}$ is not generated to be at an "L" level, so that the "H" level on the Y gate line 22 is transferred to a node of the transistors Q3 and Q4 of the flip-flop. When an input portion of the first inverter, i.e., the node of the transistors Q3 and Q4 becomes an "H" level, correspondingly the output of the second inverter (a node of the transistors Q5 and Q6) applies a signal at an "L" level to the input portion of the first inverter of the transistors Q3 and Q4. Thus, the node of the transistors Q3 and Q4 is held at an "H" level. That is, the latch circuit is set. In the data writing and erasing verify cycle, when the Y gate line 22 is brought into an electrically floating state, the clock signal CLK becomes an "H" level and a high potential pulse $V_{pp}$ becomes an "L" level, the AND gate 40 generates a signal at an "H" level, so that the MOS transistor Q1 is turned on. As a result, the "H" level latched in the latch circuit is transferred to the Y gate line 22 in a floating state, so that the Y gate line 22 becomes an "H" level. Thus, the selected Y gate line and a non-selected Y gate line can be identified.

After erasing is verified, the reset signal RS is generated, so that the transistor Q2 is turned on. As a result, the "H" level latched in the latch circuit changes into an "L" level, so that the latch circuit is reset.

Although the structure of the latch circuit according to the above described embodiment is described by way of an example, a latch circuit with the other structure may be used, in which case the same effect can be obtained.

As described in the foregoing, according to the present invention, since the output line of the Y decoder is provided with the second latch circuit which is set by the selected Y gate line for outputting the latched data to the Y gate line at the time of erasing verify cycle, erasing of the selected byte memory cells connected to the selected one page can be surely verified for every bit when data is collectively written in a page mode, so that a reliable nonvolatile semiconductor memory device can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device having a plurality of memory cells each connected to a single row selecting signal line and a single column selecting signal line, said nonvolatile semiconductor memory device storing electrically programmable and erasable information in a nonvolatile manner, comprising:

row selecting means responsive to an externally generated row designating signal for selecting a corresponding row selecting signal line;

column selecting means responsive to an externally generated column designating signal for selecting a corresponding column selecting signal line;

column latch means coupled to said column selecting signal lines and a data output line for temporarily storing column information selected by said column selecting means at the time of a data writing cycle and actuating said selected column in response to said temporarily stored column information to verify that data has been erased from a selected byte, and connecting a memory cell connected to said selected column to the data output line.

2. A nonvolatile semiconductor memory device in accordance with claim 1, further comprising:

data latch means for temporarily storing data to be written into a memory cell selected by said row selecting means and column selecting means, data erasing means for erasing data stored in the memory cell selected by said row selecting means and column selecting means after said data to be written is latched by said data latch means, and erase determination means for reading out information stored in the memory cell connected to the column selecting signal line selected in response to the column information stored by said column latch means for determining whether said information stored in the memory cell is erased or not, after completion of erasing operation by said data erasing means.

3. A nonvolatile semiconductor memory device in accordance with claim 2, wherein each of said column selecting signal lines is connected to a data output line through a transfer gate having a gate receiving a column selecting signal from said column selecting means, and said column latch means is provided between an output portion of said column selecting means and said transfer gate, so that the transfer gate connected to the column selecting signal line selected by said column selecting means is rendered conductive while said erase determination means is operated.

4. A nonvolatile semiconductor memory device in accordance with claim 3, wherein said erase determination means comprises AND gate means responsive to a signal appearing on a data output line through said transfer gate.

5. A nonvolatile semiconductor memory device in accordance with claim 1, wherein said nonvolatile semiconductor memory device comprises an electrically programmable and erasable nonvolatile semiconductor memory device operable in a page mode which can collectively write in parallel data of a plurality of bytes.

6. In a nonvolatile electrically programmable and erasable semiconductor memory device operable in a page mode, said device having a plurality of memory cells each connected to a single row selecting signal line and a single column selecting signal line, said device including row selecting means for selecting a corresponding row selecting signal line in response to an external row designating signal; column selecting means for selecting a corresponding column selecting signal line in response to an external column designating signal; column latch means for temporarily storing column information selected by the column selecting means; data latch means for temporarily storing data to be written into a memory cell selected by the row selecting means and the column selecting means; data erasing means for erasing data stored in the memory cell selected by the row selecting means and column selecting means after the data to be written is latched by the data latch means; erase determination means for reading out information stored in the memory cell in response to the column information stored by the column latch means;

a method of verifying that information has been erased from a selected byte in said memory device at the time of a data writing cycle, said method comprising the following steps:

selecting a corresponding row selecting signal line in response to said externally generated row designating signal;
selecting a corresponding column selecting signal line in response to said externally generated column designating signal;
temporarily storing said selected column information;
temporarily storing said data to be written into a selected memory cell corresponding to selected row and column selecting segment lines;

erasing the data already stored in said selected memory cell after said data to be written is temporarily stored; and
reading out information stored in said selected memory cell to verify whether said selected memory cell is erased or not.

7. In an electrically programable and erasable memory device as set forth in claim 6, repeating said erasing step when said selected memory cell has not been previously erased.

* * * * *